US006605195B2

(12) United States Patent
McLeod

(10) Patent No.: US 6,605,195 B2
(45) Date of Patent: Aug. 12, 2003

(54) MULTI-LAYER DEPOSITION PROCESS USING FOUR RING SPUTTER SOURCES

(75) Inventor: Paul Stephen McLeod, Berkeley, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/834,102

(22) Filed: Apr. 12, 2001

(65) Prior Publication Data

US 2002/0104752 A1 Aug. 8, 2002

Related U.S. Application Data

(60) Provisional application No. 60/197,229, filed on Apr. 14, 2000.

(51) Int. Cl.[7] ............................................... C23C 14/34
(52) U.S. Cl. ............................ 204/192.12; 204/298.06; 204/298.08; 204/298.15; 204/298.23; 204/298.28
(58) Field of Search ........................ 204/192.12, 298.15, 204/298.06, 298.08, 298.23, 298.28

(56) References Cited

U.S. PATENT DOCUMENTS 4,041,353 A    8/1977   Penfold et al. ............. 315/267
4,111,782 A    9/1978   Penfold et al. ............. 204/298
4,116,793 A    9/1978   Penfold et al. ......... 204/192 R
4,116,794 A    9/1978   Penfold et al. ......... 204/192 R
4,132,612 A    1/1979   Penfold et al. ......... 204/192 R
4,132,613 A    1/1979   Penfold et al. ......... 204/192 R
4,158,153 A    6/1979   Eckberg ..................... 313/491
4,233,497 A   11/1980   Lowell ....................... 219/468
4,241,592 A   12/1980   Tapphorn ................. 62/514 R
4,245,954 A    1/1981   Glenn ......................... 415/200
4,259,021 A    3/1981   Goudy, Jr. .................. 366/118
4,269,137 A    5/1981   Johnson ..................... 118/50.1
4,279,700 A    7/1981   Boyle et al. .................. 176/68

(List continued on next page.)

Primary Examiner—Steven H. VerSteeg
(74) Attorney, Agent, or Firm—Raghunath S. Minisandram; Jesus Del Castillo

(57) ABSTRACT

A sputtering apparatus for depositing layers of material onto a substrate includes a vacuum chamber, a first target and a second target positioned within the vacuum chamber. A source of power is placed in electrical communication with the first target and the second target. A switch alternately connects the source of power between the first target and the second target. The first target and the second target are different materials. The switch connects power to the first target when the transport mechanism positions the substrate near the first target and the switch connects power to the second target when the transport mechanism positions the substrate closer to the second target.

19 Claims, 8 Drawing Sheets

U.S. PATENT DOCUMENTS

| | | | |
|---|---|---|---|
| 4,310,614 A | 1/1982 | Connell et al. | 430/271 |
| 4,313,815 A | 2/1982 | Graves, Jr. et al. | 204/298 |
| 4,329,563 A | 5/1982 | Komura et al. | 219/121 P |
| 4,339,656 A | 7/1982 | Komura et al. | 219/494 |
| 4,341,947 A | 7/1982 | Komura et al. | 219/38 |
| 4,357,536 A | 11/1982 | Varma et al. | 250/397 |
| 4,410,792 A | 10/1983 | Komura et al. | 219/383 |
| 4,422,125 A | 12/1983 | Antonazzi et al. | 361/283 |
| 4,485,000 A | 11/1984 | Kawaguchi et al. | 204/298 |
| 4,556,471 A | 12/1985 | Bergman et al. | 204/298 |
| 4,558,388 A | 12/1985 | Graves, Jr. | 360/135 |
| 4,569,746 A | 2/1986 | Hutchinson | 204/298 |
| 4,570,166 A | 2/1986 | Kuhn et al. | 343/872 |
| 4,595,482 A | 6/1986 | Mintz | 204/298 |
| 4,606,806 A | 8/1986 | Helmer | 204/298 |
| 4,610,774 A | 9/1986 | Sakata et al. | 204/298 |
| 4,622,121 A | 11/1986 | Wegmann et al. | 204/298 |
| 4,627,902 A | 12/1986 | Johnston et al. | 204/192.21 |
| 4,627,904 A | 12/1986 | Mintz | 204/298 |
| 4,638,335 A | 1/1987 | Smith et al. | 346/135.1 |
| 4,644,793 A | 2/1987 | Church | 73/505 |
| 4,657,654 A | 4/1987 | Mintz | 204/298 |
| 4,661,228 A | 4/1987 | Mintz | 204/192.25 |
| 4,682,564 A | 7/1987 | Cann | 118/620 |
| 4,692,230 A * | 9/1987 | Nihei et al. | 204/192.31 |
| 4,693,695 A | 9/1987 | Cheng | 442/220 |
| 4,707,762 A | 11/1987 | Yapoujian | 361/124 |
| 4,733,086 A | 3/1988 | Simmonds et al. | 250/423 P |
| 4,734,915 A | 3/1988 | Mefferd et al. | 372/61 |
| 4,735,701 A | 4/1988 | Allen et al. | 204/298 |
| 4,837,068 A | 6/1989 | Martin et al. | 428/133 |
| 4,841,408 A | 6/1989 | Matsunaga et al. | 361/220 |
| 4,842,704 A | 6/1989 | Collins et al. | 204/192.24 |
| 4,865,712 A | 9/1989 | Mintz | 204/298 |
| 4,950,499 A | 8/1990 | Martin et al. | 427/38 |
| 4,951,174 A | 8/1990 | Grantham et al. | 361/283 |
| 4,960,753 A | 10/1990 | Collins et al. | 505/1 |
| 4,978,187 A | 12/1990 | Minemura et al. | 350/96.11 |
| 5,002,567 A | 3/1991 | Bona et al. | 623/2 |
| 5,010,043 A | 4/1991 | Ringwood | 501/90 |
| 5,096,301 A | 3/1992 | Stanley | 356/73.1 |
| 5,160,575 A | 11/1992 | Chen | 156/620.7 |
| 5,166,006 A | 11/1992 | Lal et al. | 428/612 |
| 5,167,096 A | 12/1992 | Eltoukhy et al. | 51/281 SF |
| 5,241,340 A | 8/1993 | Fraser et al. | 355/27 |
| 5,244,555 A | 9/1993 | Allen et al. | 204/192.2 |
| 5,252,194 A | 10/1993 | Demaray et al. | 204/298.2 |
| 5,308,594 A | 5/1994 | Chen | 117/222 |
| 5,308,989 A | 5/1994 | Brubaker | 250/441.11 |
| 5,312,663 A | 5/1994 | Kosinski et al. | 428/64 |
| 5,366,585 A | 11/1994 | Robertson et al. | 156/643 |
| RE34,806 E | 12/1994 | Cann | 427/446 |
| 5,437,210 A | 8/1995 | Fraser et al. | 74/567 |
| 5,568,115 A * | 10/1996 | Kano et al. | 338/32 R |
| 5,576,600 A | 11/1996 | McCrary et al. | 315/111.81 |
| 5,593,602 A | 1/1997 | Gelder et al. | 216/42 |
| 5,597,459 A | 1/1997 | Altshuler | 204/192.12 |
| 5,656,138 A | 8/1997 | Scobey et al. | 204/192.12 |
| 5,828,491 A | 10/1998 | Neuman et al. | 359/565 |
| RE35,947 E | 11/1998 | Kosinski et al. | 428/64.1 |
| 5,855,118 A | 1/1999 | Lorimer | 62/55.5 |
| 5,855,685 A | 1/1999 | Tobe et al. | 118/723 |
| 5,876,684 A | 3/1999 | Withers et al. | 423/445 B |
| 5,895,582 A | 4/1999 | Wilson et al. | 216/42 |
| 6,096,174 A * | 8/2000 | Teschner et al. | 204/192.12 |
| 6,264,804 B1 * | 7/2001 | Lee et al. | 204/192.12 |

* cited by examiner

MULTI-LAYER DEPOSITION PROCESS USING FOUR RING SPUTTER SOURCES

RELATED APPLICATION

This application claims the benefit of U.S. Provisional Application Ser. No. 60/197,229 filed Apr. 14, 2000 under 35 U.S.C. 119(e).

FIELD OF THE INVENTION

The present invention relates to the field of mass storage devices. More particularly, this invention relates to a method and apparatus for depositing a multiple layers on a storage disc.

BACKGROUND OF THE INVENTION

One key component of any computer system is a device to store data. Computer systems have many different places where data can be stored. One common place for storing massive amounts of data in a computer system is on a disc drive. The most basic parts of a disc drive are an information storage disc that is rotated, an actuator that moves a transducer to various locations over the disc, and electrical circuitry that is used to write and read data to and from the disc. The disc drive also includes circuitry for encoding data so that it can be successfully retrieved and written to the disc surface. A microprocessor controls most of the operations of the disc drive as well as passing the data back to the requesting computer and taking data from a requesting computer for storing to the disc.

The transducer is typically placed on a small ceramic block, also referred to as a slider that is aerodynamically designed so that it flies over the disc. The slider is passed over the disc in a transducing relationship with the disc. Most sliders have an air-bearing surface (ABS), which includes rails and a cavity between the rails. When the disc rotates (generally, at rotational speeds of 10,000 RPM or higher), air is dragged between the rails and the disc surface causing pressure, which forces the head away from the disc. At the same time, the air rushing past the cavity or depression in the air-bearing surface produces a negative pressure area. The negative pressure or suction counteracts the pressure produced at the rails. The slider is also attached to a load spring, which produces a force on the slider directed toward the disc surface. The various forces on the slider equilibrate, so that the slider flies over the surface of the disc at a particular desired fly height. The fly height is the distance between the disc surface and the transducing head, which is typically the thickness of the air lubrication film. This film eliminates the friction and resulting wear that could occur if the transducing head and disc were in mechanical contact during disc rotation.

Information representative of data is stored on the surface of the memory disc. Disc drive systems read and write information stored on tracks on memory discs. Transducers, in the form of read/write heads attached to the sliders, located on both sides of the memory disc, read and write information on the memory discs when the transducers are accurately positioned over one of the designated tracks on the surface of the memory disc. The transducer is also said to be moved to a target track. As the memory disc spins, the read/write head is accurately positioned above a target track and current is passed through the write head which in turn magnetizes a small area of the magnetic layer on the disc. The write head includes a coil of wire. Passing current through the write head results in a magnetic field in a gap near the surface of the disc. The magnetic field acts to magnetize a small area of the disc. This process is also known as writing information representative of data onto the memory disc. Similarly, reading data on a memory disc is accomplished by positioning the read/write head above a target track and reading the stored material on the memory disc.

The best performance of the disc drive results when the slider is flown as closely to the surface of the disc as possible. In operation, the distance between the slider and the disc is very small; currently "fly" heights or head media spacing is about 1–2 micro inches. It is contemplated that smaller fly heights or head media spacing will be achieved in the future since this is one factor in achieving increased recording density.

The constant demand for increasing hard drive recording density has resulted in drastic changes in disc drives over the years. One of the areas of change that has been necessary to increase the capacity of the disc drive is to place different types of magnetic layers onto the surface of the disc. Enhanced magnetic layers provide capacity since smaller and smaller portions of the magnetic layer and smaller portions of the disc surface are needed to store a "1" or a "0"(the information representing data). In other words, smaller magnetic layers are needed to define domains which must be flipped to store information representing data. One of the media enhancements includes a disc having as many as 30 alternating thin, metal layers such as Cobalt and Platinum. Each layer of material is from 5 to 8 Angstroms thick.

In the disc drive industry, high-performance, thin-film storage discs are generally produced by depositing successive layers on a substrate apparatus. For storage discs of the type formed on a rigid disc substrate, each successive layer on the storage disc is deposited in a separate chamber. Producing such a disc with a multiplicity of magnetic layer including as many as thirty thin layers alternating between Cobalt and Platinum using conventional sputtering devices would result in high capital costs and a lengthy process with a long throughput time. Producing such a disc would generally require many sputtering stations, one sputtering cobalt and the next sputtering platinum. The process would be long in terms of time since the disc would have to be moved many times into various chambers. The result is that there is not an efficient deposition process or sputtering apparatus that could deposit multiple very thin layers onto the surface of a disc. Therefore, there is a need for a method and apparatus that could be used to form multiple thin layers of alternating material onto a substrate surface.

SUMMARY OF THE INVENTION

A method for sputtering within a chamber includes the steps of placing at least two source materials within a chamber, electrically connecting a source of power to one of the source materials within the chamber to sputter a first layer onto a substrate, and disconnecting a source of power from one of the source materials and electrically connecting the source of power to the other of the source materials within the chamber to sputter a second layer onto a substrate. The method further includes the step of moving the substrate closer to the source connected to the source of power. Some embodiments further include the step of spinning the substrate within the chamber. The method may also include holding the substrate by an inner diameter within the chamber. The method for sputtering within a chamber also includes the step of alternately connecting power to one of the sources and then to another source to place a desired number of alternating layers of material on the substrate.

A sputtering apparatus for depositing layers of material onto a substrate includes a vacuum chamber, a first target and a second target positioned within the vacuum chamber. A source of power is placed in electrical communication with the first target and the second target. A switch alternately connects the source of power between the first target and the second target. The first target and the second target are different materials. The sputtering apparatus also includes a transport mechanism for moving a substrate between a first position closer to the first target and a second position closer to the second target. The switch connects power to the first target when the transport mechanism positions the substrate near the first target and the switch connects power to the second target when the transport mechanism positions the substrate closer to the second target. In one embodiment, the first target is ring-shaped and the second target is ring-shaped.

In other embodiments, the sputtering apparatus includes a third target and a fourth target. The first target, second target, third target, and fourth target are ring-shaped. The transport mechanism moves a substrate between a first position between the first target and the third target, and a second position between the second target and the fourth target. The first and third target are attached to the source of power when a substrate is positioned in a first position between the first and third target, and the second target and fourth target are attached to the source of power when a substrate is positioned in a second position between the second and fourth targets. The first target and third target are made of a first material. The second target and fourth target are made of a second material. The material of the first and third target is deposited on a substrate when in a first position, and the material of the second and fourth target are deposited on a substrate when in a second position.

The sputtering apparatus may handle a substrate that includes an inner diameter and an outer diameter. The transport mechanism for such a substrate includes a holder for holding a substrate by the inner diameter. The transport mechanism may also include a bellows for sealing the chamber when the substrate is placed in a first position and in a second position. In some embodiments, the sputtering apparatus for a substrate having an inner diameter and an outer diameter, includes a holder for holding a substrate by the inner diameter, a ram attached to the holder, and a bellows to seal the chamber and the transport mechanism. In some embodiments, the transport mechanism includes a rotator for rotating the substrate.

Most generally, a sputtering apparatus includes a chamber, and a device for sputtering layers of alternating material onto a substrate positioned within the chamber.

Advantageously, the method and apparatus described above provides a process which significantly reduces the process time necessary to place multiple layers of alternating material on a substrate.

DESCRIPTION OF THE PREFERRED EMBODIMENT

In the following detailed description of the preferred embodiments, reference is made to the accompanying drawings, which form a part hereof, and in which are shown by way of illustration specific embodiments in which the invention may be practiced. It is to be understood that other embodiments may be utilized and structural changes may be made without departing from the scope of the present invention.

The invention described in this application is useful with all mechanical configurations of disc drives having either rotary or linear actuation. In addition, the invention is also useful in all types of disc drives including hard disc drives, zip drives, floppy disc drives and any other type of drive where unloading the transducer from a surface and parking the transducer may be desirable.

Figure 1:
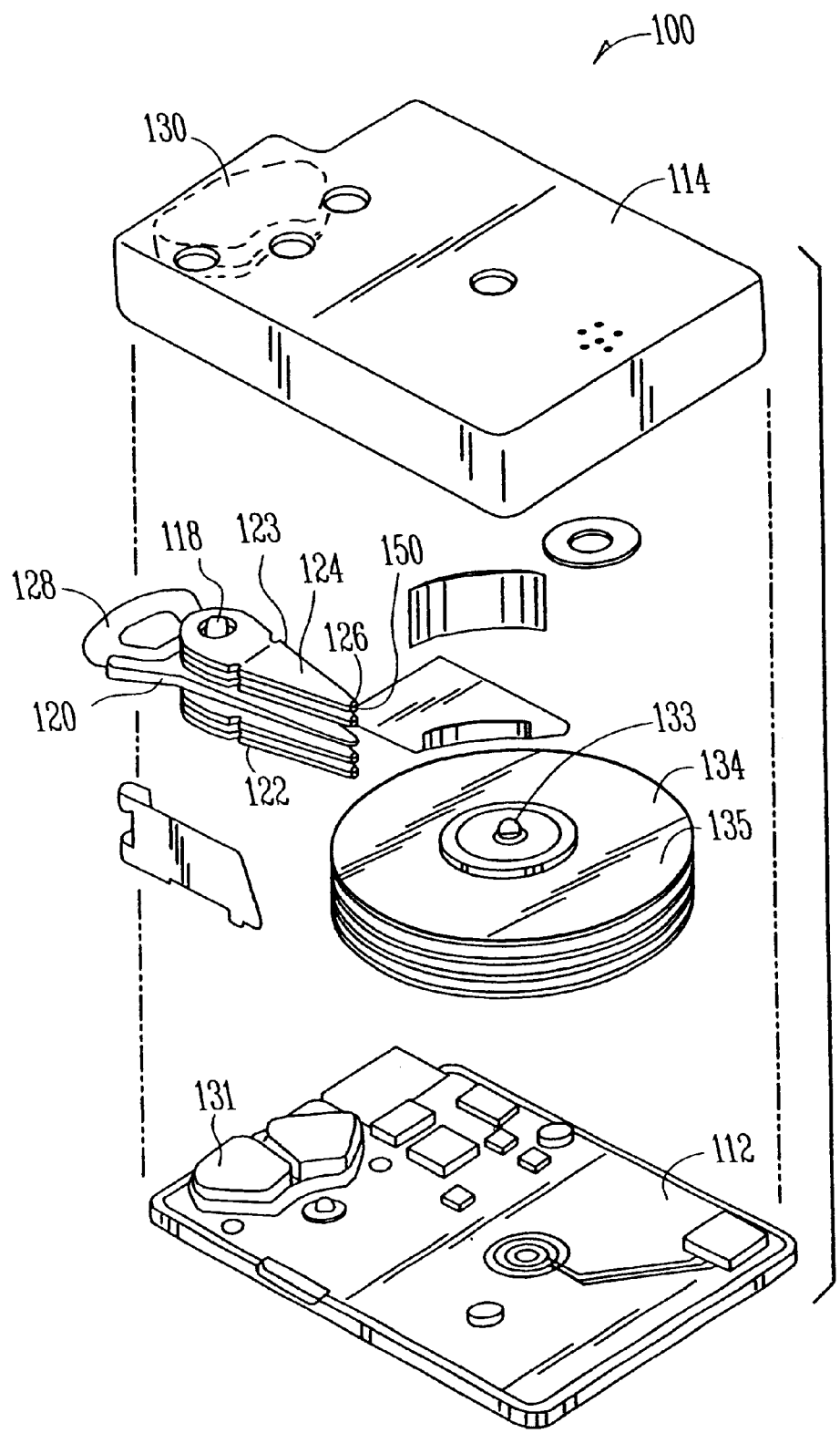
FIG. 1 is an exploded view of a disc drive with a multiple disc stack.

FIG. 1 is an exploded view of one type of a disc drive 100 having a rotary actuator. The disc drive 100 includes a housing or a base 112, and a cover 114. The base 112 and cover 114 form a disc enclosure. Rotatably attached to the base 112 on an actuator shaft 118 is an actuator assembly 120. The actuator assembly 120 includes a comb-like structure 122 having a plurality of actuator arms 123. Attached to the separate arms 123 on the comb 122, are load beams or load springs 124. Load beams or load springs are also referred to as suspensions. Attached at the end of each load spring 124 is a slider 126, which carries a magnetic transducer 150. The slider 126 with the transducer 150 form what is often called the head. The head with the load spring 124 is often called the head gimbal assembly. It should be noted that many sliders have one transducer 150 and that is what is shown in the figures. It should also be noted that this invention is equally applicable to sliders having more than one transducer, such as what is referred to as an MR or magneto resistive head in which one transducer 150 is generally used for reading and another is generally used for writing. On the end of the actuator arm assembly 120 opposite the load springs 124 and the sliders 126 is a voice coil 128.

Attached within the base 112 is a first magnet 130 and a second magnet 131. As shown in FIG. 1, the first magnet 130 is associated with the cover 114 and the second magnet 131 is associated with the base 112. The first and second magnets 130, 131, and the voice coil 128 are the key components of a voice coil motor, which applies a force to the actuator assembly 120 to rotate it about the actuator shaft 118 and the bearing cartridge 119. Also mounted to the base 112 is a spindle motor. The spindle motor includes a rotating portion called the spindle hub 133. In this particular disc drive, the spindle motor is within the hub. In FIG. 1, a number of discs 134 are attached to the spindle hub 133. Each of the discs 134 has a recording surface 135. Only one disc 134 is numbered for the sake of clarity. In other disc drives a single disc or a different number of discs may be attached to the hub. The invention described herein is equally applicable to disc drives which have a plurality of discs as well as disc drives that have a single disc. The invention described herein is also equally applicable to disc drives with spindle motors, which are within the hub 133 or under the hub.

Figure 2:
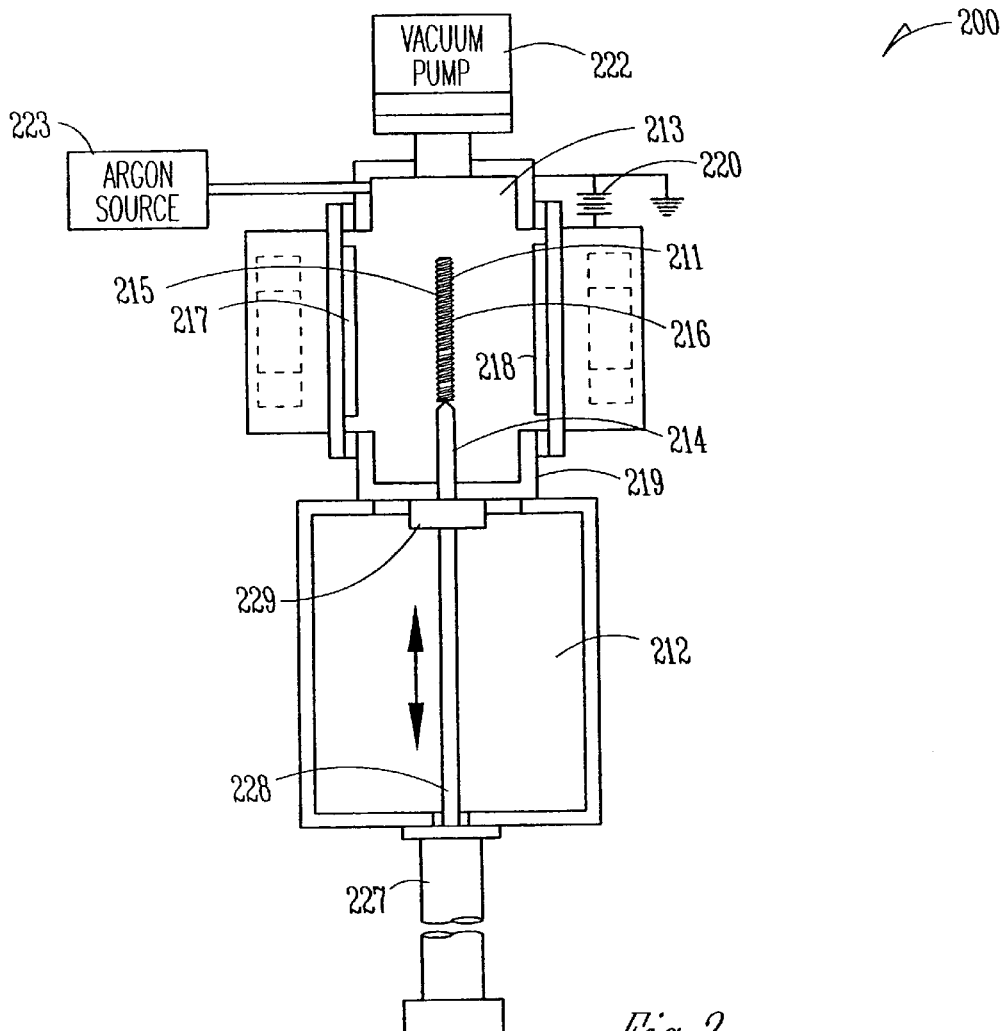
FIG. 2 illustrates a prior art sputtering machine.

FIG. 2 illustrates a prior art sputtering machine 200. The sputtering machine 200 includes a vacuum sputtering chamber 213, a vacuum pump 222 in fluid communication with the chamber 213, and a first target 217 and a second target 218. A substrate 211, preferably fabricated as a rigid non-magnetic preferably aluminum disc (such as disc 134 shown in FIG. 1) is vertically translated by a blade 214 between a vacuum handling chamber 212 and the vacuum sputter coating chamber 213. While the substrate 211 is coated, blade 214 holds the substrate 211 on edge so that parallel, planar faces 215 and 216 of the substrate 211 are vertically disposed. By positioning substrate 211 so that faces 215 and 216 are vertically disposed, settling of particulates, having a tendency to be generated in vacuum chamber 213 during the sputtering operation, is minimized so that surfaces 215 and 216 remain relatively free of contaminants.

Faces 215 and 216 are simultaneously coated with material emitted from targets 217 and 218 which are disposed in chamber 213 so that the targets respectively face faces 215 and 216. To provide the sputtering effect, targets 217 and 218 form part of a cathode electrode. When it is desired to coat disc 211 to form a magnetic disc of the type employed in computers, targets 217 and 218 are fabricated of a magnetic material which, when deposited on substrate 211, is capable of storing magnetic information. To provide a cathode sputtering plasma between targets 217 and 218 and substrate 211, an envelope 219 of chamber 213 serves as an anode electrode. A direct current ("DC") source 220 maintains targets 217 and 218 at a relatively high, negative DC voltage, while metal envelope 219 is grounded. An inert gas, typically argon, is supplied from a suitable source 223 to the interior of chamber 213, that is evacuated by vacuum source 222.

After the coating process has been completed, the blade 214 is lowered, to return the substrate 211 to the handling chamber 212. After the substrate 211 has been returned to the handling chamber 212, it is removed from the blade 214 and transported, by suitable means (not shown) to another vacuum coating station or to an unloading vacuum lock station. The entire time while the substrate 211 is held by blade 214, the substrate is held on edge, so that the faces 215 and 216 are vertically disposed.

To raise and lower the blade 214 and substrate 211 and maintain the blade and substrate in situ during the coating operation, an actuating cylinder 227, preferably driven by a pneumatic source, is provided. Cylinder 227 drives a piston 228, having an upper horizontal face to which a platform 229 is secured. Platform 229 carries the blade 214.

The sputtering machine 200 described in FIG. 2 has limited capability. In the sputtering machine 200, the targets 218 and 217 each are of the same material and therefore, in order to place another layer of another material onto a layer sputtered within the chamber 213, the substrate 211 must be removed and placed into another sputtering machine which includes targets having a material which corresponds to the desired second layer. Thus, to put as many as 30 alternating thin metal layers onto a substrate 211 would require approximately 30 trips between two sputtering machines 200 or would require 30 sputtering machines carrying targets 217, 218 having varying material of the desired alternating layers. Throughput would be very slow since the substrate 211 would be removed from chamber 213 in each of a number of devices and then placed in a new device to put on a new layer of material.

Figure 3:
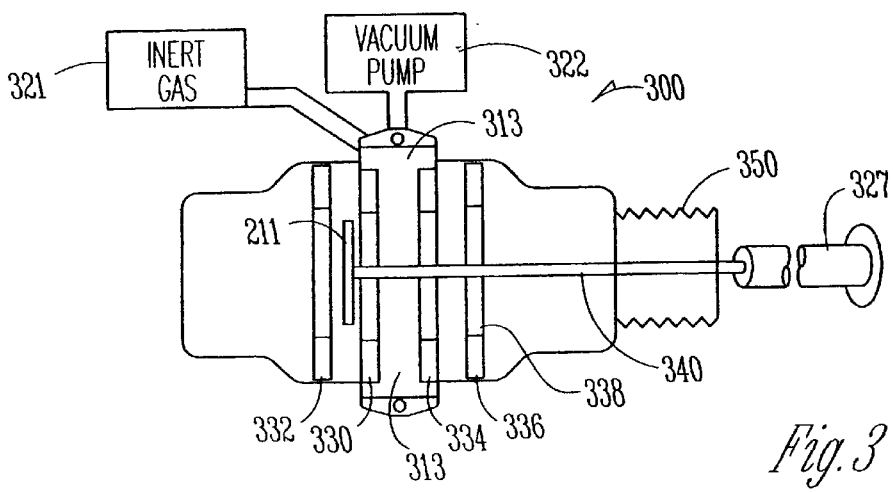
FIG. 3 is a sputtering machine for depositing multiple alternate layers onto a substrate according to the present invention with a substrate in a first position.
Figure 4:
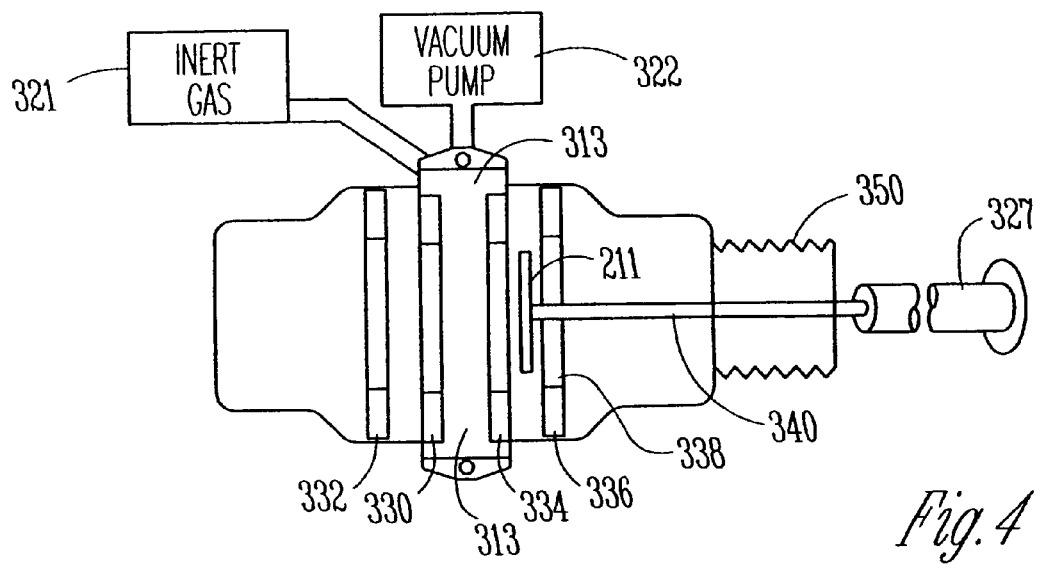
FIG. 4 is a sputtering machine for depositing multiple alternate layers onto a substrate according to the present invention with a substrate in a second position.

FIGS. 3 and 4 show a sputtering machine 300 for depositing multiple alternate layers onto a substrate 211 according to the present invention. In FIG. 3, the substrate 211 is in a first position and in FIG. 4, the substrate 211 is in a second position. The sputtering machine 300 includes a vacuum sputtering chamber 313, a vacuum pump 322 attached to the vacuum sputtering chamber 313 and a source of inert gas 321 which is also attached to the vacuum sputtering chamber 313. Positioned within the vacuum sputtering chamber 313 are two sets of ring targets. The first set of ring targets 330, 332 is made from a first material and a second set of targets 334, 336 is made from a second material. Each of the targets 330, 332, 334, 336 is made of a ring shape and includes an opening 338 which has a diameter greater than the outside diameter of the substrate 211. The opening 338 in each of the targets 330, 332, 334, 336 allows the substrate 211 to be moved to different positions with respect to the targets 330, 332, 334, 336. As shown in FIG. 3, the substrate 211 is in a first position between targets 330 and 332. FIG. 4 shows the substrate 211 in a second position between substrates 334 and 336. The substrate is attached to a linear actuator 340 which is in turn attached to a cylinder 327. The cylinder 327 may be a pneumatic cylinder. The cylinder 327 moves the actuator 340 between a first position and a second position. Attached between the cylinder 327 and the vacuum chamber 313 is a bellows 350. The bellows 350 maintains a seal between the vacuum chamber 313 and the area around the linear actuator where the linear actuator 340 passes into the chamber 313.

Figure 5:
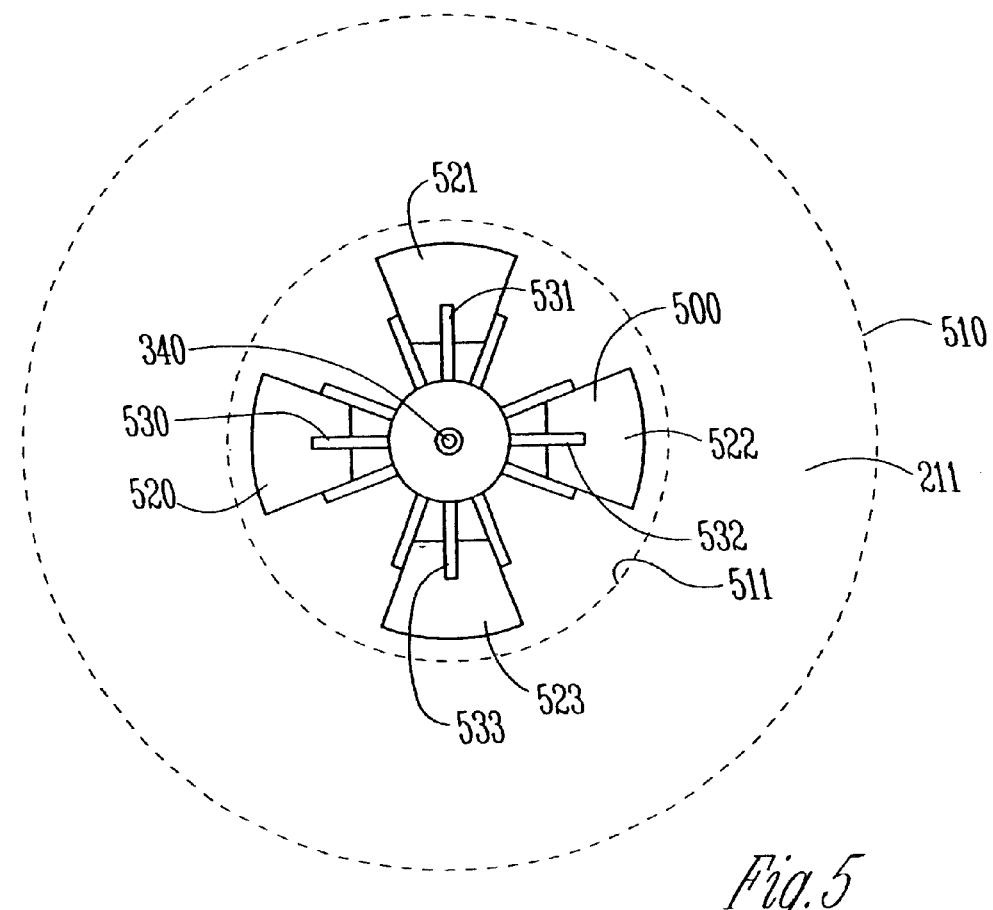
FIG. 5 is a mechanism for holding a substrate having an opening therein on its inner diameter.

The linear actuator 340 is attached to the cylinder 327 at one end and is attached to the substrate 211 at the other end or its free end. FIG. 5 shows an ID gripper 500 for holding a substrate 211. The substrate 211 includes an outer diameter 510 and an inner diameter 511. The ID gripper 500 includes a plurality of radially extending wings 520, 521, 522, and 523. The radially extending wings 520, 521, 522, 523 include a pin or slide 530, 531, 532, 533. The wings 520, 521, 522, 523 slide upon the pins 530, 531, 532, 533 so that the outermost edges of the wings 520, 521, 522, 523 engage the inner diameter 511 of the substrate 211. Of course, this is one arrangement of a holder or mechanism for holding a substrate 211 having an opening with an inner diameter 511. It should be noted that other mechanisms for holding the disc by the inner diameter can also be used and still be within the scope of this invention.

Figure 6:
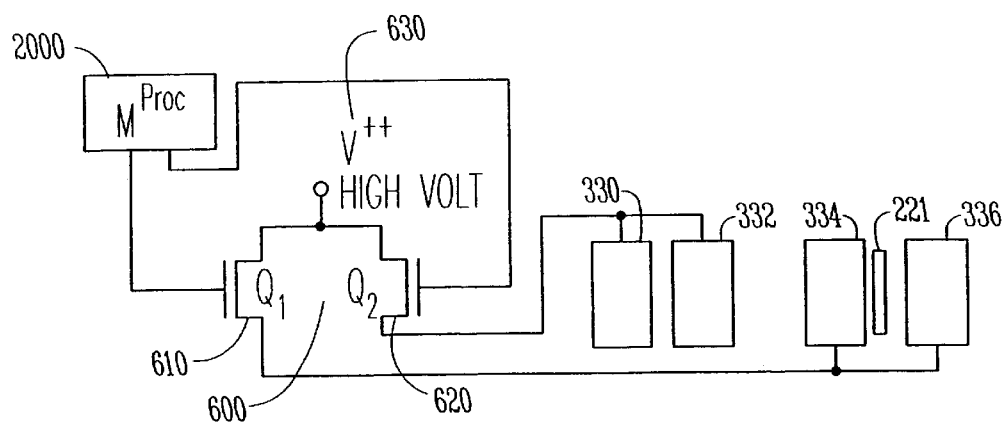
FIG. 6 is a switch under microprocessor control for depositing multiple alternate layers onto a substrate according to an embodiment of the present invention.

FIG. 6 shows a switch 600. The switch 600 is under control of a microprocessor 2000. The microprocessor 2000 controls a first transistor 610 and a second transistor 620 so that power from a high voltage source 630 is either placed on target 330, 332 or to targets 334, 336. As shown in FIG. 6, substrate 211 is in the second position which is between targets 334 and 336. In operation, the microprocessor places high potential on the targets 334, 336 when the substrate 221 is positioned between the two targets and removes high potential from the targets 330, 332 when the substrate 221 is not positioned near the two targets. Thus, using one vacuum chamber 313, multiple alternating layers of different material can be applied to a substrate 221. Referring now to FIG. 6, FIG. 3 and FIG. 4, the operation will now be more fully described. The actuator 340 and cylinder 327 move the substrate between a first position, between targets 330 and 332, and a second position between targets 334 and 336. The switch 600 places an electrical charge on the targets during the time when the substrate 211 is positioned between two of the four targets. When the substrate 211 is not positioned between a pair of targets, the voltage or high potential is removed from those two targets. Thus, as the substrate is moved between a first position and a second position, the microprocessor 2000 controls the switch 600 to charge the plates as the position of the substrate 221 alternates. For example, when the substrate 211 is in a first position, as shown in FIG. 3, the transistor 610 will be enabled to allow the plates 330, 332 to be charged. Within the vacuum chamber, an inert gas such as argon bombards the targets and displaces material from the target so that it can be sputtered or deposited on the substrate 211. After a specified amount of time, the actuator 340 and cylinder 327 move the substrate 211 to a second position between targets 334 and 336. As the substrate is moved, the potential is removed from targets 330 and 332 and placed onto the targets 334 and 336. When the substrate 211 is positioned between targets 334 and 336, the microprocessor 2000 enables transistor 610 to place a high potential on targets 334 and 336 and disables the transistor 620. The targets 334, 336 are located within the vacuum chamber 313 and the high potential causes ions in an inert gas to bombard the target and produce a plasma which is deposited onto the substrate 211 for a selected amount of time. The actuator then moves the substrate 211 back to a position between targets 332 and 330 and enables the transistor 620 so that targets 330 and 332 are at high potential which causes a plasma to be formed and another thin layer or layer to be deposited onto the substrate 211 of the material of targets 330, 332. Again, after a selected amount of time, the microprocessor disables the potential or current flow through transistor 620 while the target is moved to a second position between targets 334, 336 and enables transistor 610. The result is a plasma being formed by ions of the inert gas within the vacuum chamber striking or bombarding the targets and producing a plasma. This process is repeated a desired number of times and results in layers of alternating material. In other words, after a first layer is deposited, the substrate 211 is moved to a second position as shown in FIG. 4 where another layer of material is deposited. This process is repeated until the desired number of layer pairs is achieved. It is estimated that the translation from the first position shown in FIG. 3 to the second position shown in FIG. 4 will take about 100 milliseconds which corresponds to a linear velocity of about 60 inches per second. This is a velocity often achieved by modem automation devices. The sputter cathodes or targets are ring shaped with an ID sufficient to allow a disc-shaped substrate 211 to be carried by a translation arm or actuator 340 through the opening in the ring cathodes or targets 330, 332, 334, 336. It is estimated that the total process time per disc would be approximately 7.2 seconds. This time would be an index time of 2.2 seconds, a pump-out time of 0.3 seconds and a process duration of approximately 4.7 seconds with a multilayer transfer time of approximately 100 milliseconds. The layers would be approximately 8 Angstroms in thickness. The targets would be made of cobalt and platinum. The process time for depositing 8 Angstroms of cobalt is approximately 61 milliseconds and the time required for laying down 8 Angstroms of platinum would be approximately 44 milliseconds. As a result, the microprocessor 2000 would place the target 221 between the platinum targets for a lesser amount of time than between the cobalt targets so that uniform thicknesses could be achieved between the alternating layers.

The film thickness uniformity across a disc inserted in such an assembly would be good. A ring source or target 330, 332, 334 with a 5 inch diameter erosion track would provide ±1.5% uniformity over a substrate used eventually in a disc drive which is a 95 millimeter disc. Although it is the primary intent of this invention to provide a mechanism for depositing multiple layers for vertically oriented media for a substrate 211, such a sputtering arrangement as shown in FIGS. 3, 4, 5, 6 could be used to double the number of layers grown in a system. Standard media thicknesses range from approximately 80 Angstroms for a magnetic layer to approximately 125 Angstroms for chromium layers. Typical power set points are less than 1 kW. Since the sputter source power could easily be increased by approximately 4 to 5 times that in the sputter system used here (5 kW power supplies are standard), then obviously two or more such layers could be deposited during the 4.7 second process duration window discussed above. If each pair of ring sources were different materials, then a single process station could deposit chromium and chromium tungsten and the next deposit CoCr and CoCrPtB. Thus bringing two process stations for cooling or post-magnetic annealing. Advantageously, a rotary sputtering system, like the intervac MDP 250 sputter system shown in FIG. 2 could be adapted to the four-ring sputter system shown in FIGS. 3–6. The end result is that a single sputtering station could then be used to place multiple layers or paired layers of cobalt and platinum or any other two different materials onto a substrate within a single chamber. The process time of 7.4 seconds allows for high throughput and the process would result in a set of uniform layers on the substrate 211.

Figure 7:
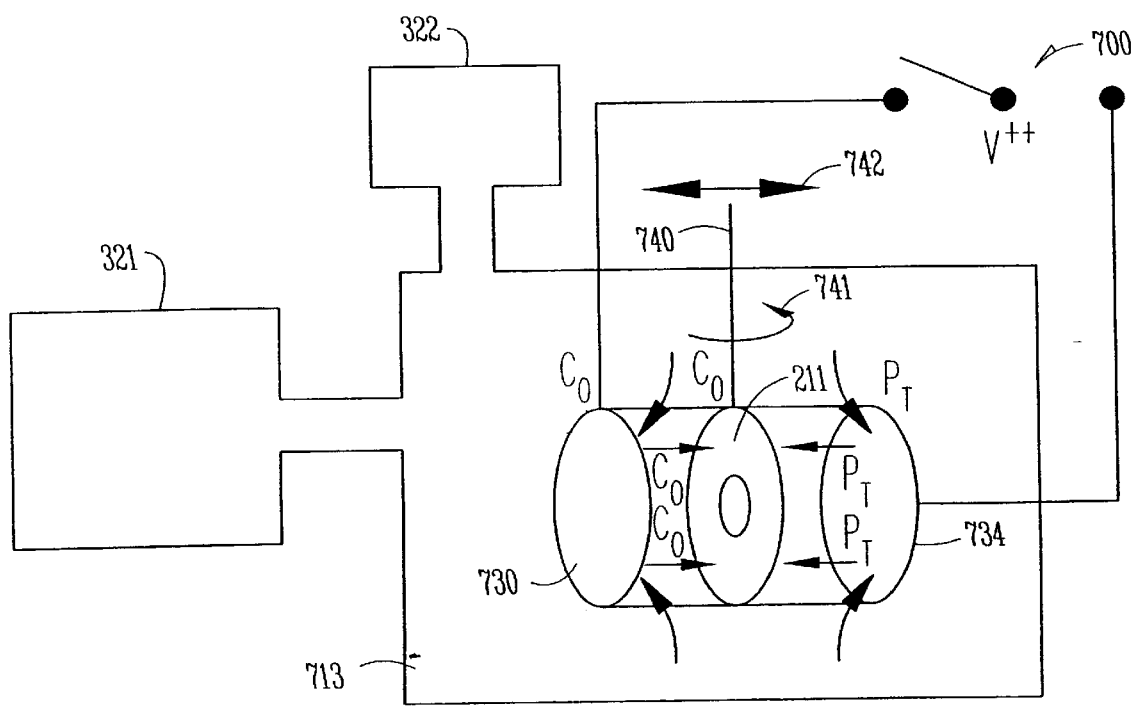
FIG. 7 is a sputtering machine for depositing multiple alternate layers onto a substrate according to another embodiment of the present invention.
Figure 8:
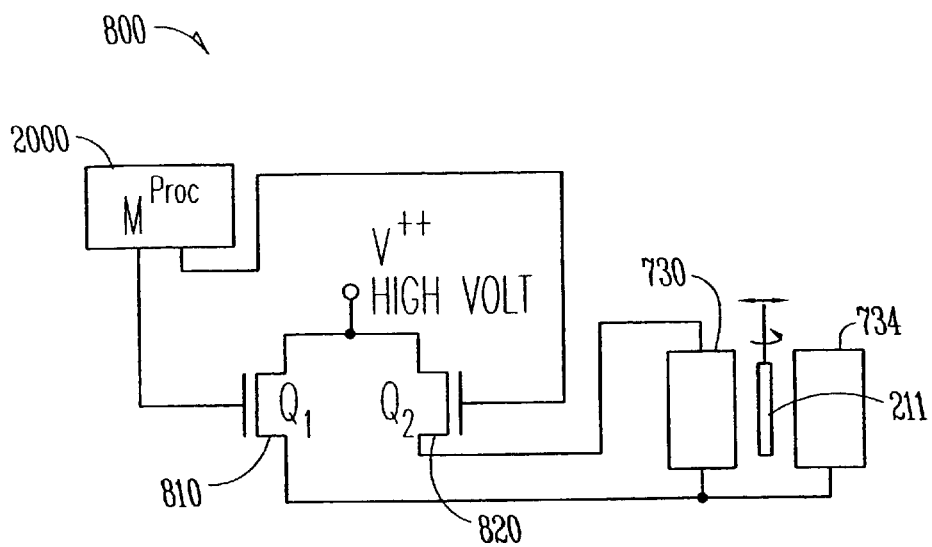
FIG. 8 is a switch under microprocessor control that could be used in the embodiment of the sputtering machine shown in FIG. 7.

FIG. 7 shows yet another embodiment of the invention for a sputtering machine depositing multiple alternate layers onto a substrate. As shown in FIG. 7, a vacuum chamber 713 is connected to a vacuum pump 322 and a source of inert gas 321. A substrate 211 is positioned in the chamber and between a first target 730 and a second target 734. The substrate 211 is attached to an actuator 740 which is capable of rotating the substrate as depicted by arrow 741 as well as translating the substrate as depicted by arrow 742. Target 730 is made of a first material such as cobalt while target 734 is made of a second material such as platinum. The actuator 740 moves the substrate 211 to a position close to the platinum target while a double-throw switch 700 attaches the platinum target 734 to the high potential source. After a selected amount of time, the actuator 740 moves the substrate 211 closer to the other target of source material 730 while the double-throw switch is positioned to place the high potential source in electrical communication with the target 730. The next step is to rotate the substrate 211 through 180E using the actuator 740 and to place the substrate near one of the targets and then the other of the targets while switching the connection of the high voltage source to the target to which the substrate 211 is near. The pattern then is to move the substrate to the opposite target after plating the first material on the nearer target. The pattern basically is place it near a first target, place it then near the second target and electrically connect the high potential source to the second target, flip or rotate the substrate 211 using actuator 740. Then place the substrate near a first target and then near a second target while making sure that the electrical potential is placed on the first and second target, respectively. The substrate 211 is then flipped again and a layer is placed on each side before it is flipped. FIG. 8 shows a switch 800 which can be substituted in for the switch 700. The switch 800 is under microprocessor 2000 control. The microprocessor 2000 (shown in FIG. 15) controls transistors 810 and 820 to place targets 730 and 734 alternately in electrical communication or connection with the high voltage source.

Figure 9:
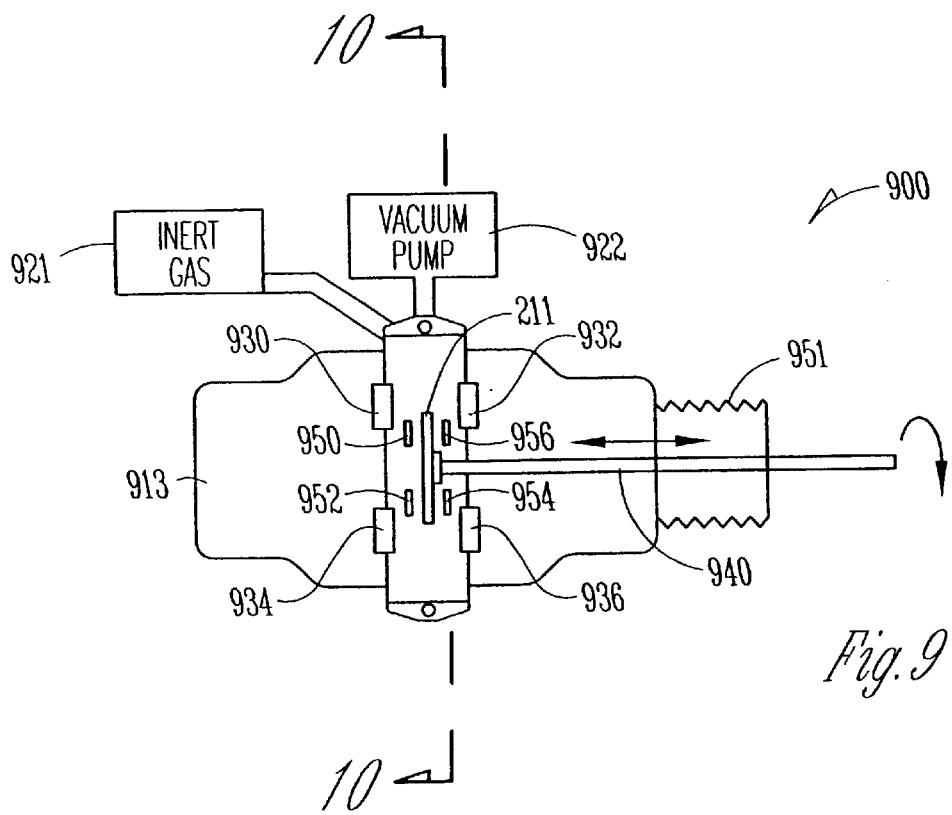
FIG. 9 is a top view of a sputtering machine for depositing multiple alternate layers onto a substrate according to still another embodiment of the present invention.
Figure 10:
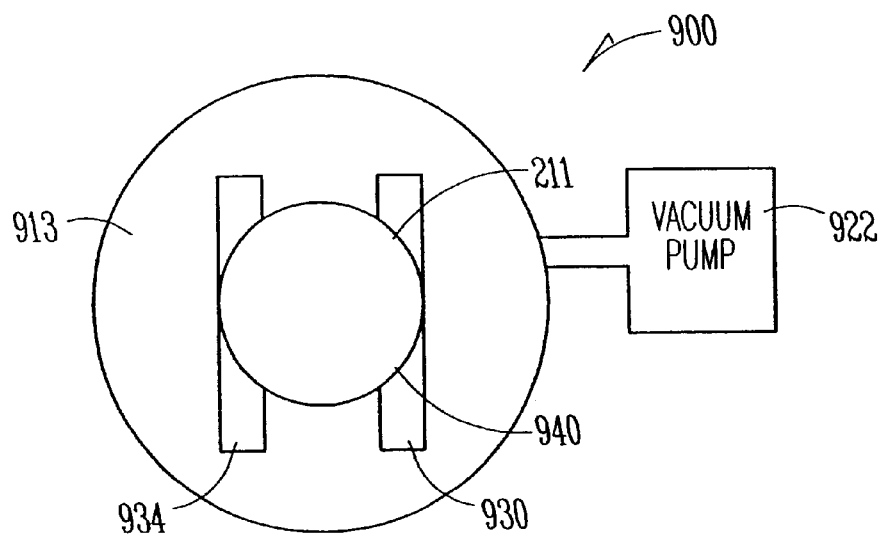
FIG. 10 is a side view of the sputtering machine shown in FIG. 9 for depositing multiple alternate layers onto a substrate.

FIGS. 9 and 10 show a top and side view of a sputtering machine 900 for depositing multiple alternate layers onto a substrate 211. The sputtering machine 900 includes a vacuum chamber 913 which is connected to or in fluid communication with a vacuum pump 922 and a source of inert gas 921. Four targets 930, 932, 934 and 936 are located within the chamber 913. An ID gripper (such as the one shown in FIG. 5) and rotator mechanism 940 which includes a shaft attached to a mechanism which can spin the shaft and the disc 211 as well as move the shaft 941 into and out of engagement with the substrate 211. The substrate 211 is typically a disc which will be formed into a magnetic disc such as those found in the disc drive 100 in FIG. 1. A substrate 211 is moved into the chamber 913. The ID gripper 500 grips the substrate 211 and rotates the substrate 211. The substrate 211 is rotated throughout the process. A bellows 951 provides for a seal between the chamber 913 and the input or rotated end of the ID gripper and rotator mechanism 940. Also positioned within the chamber are a set of film uniformity shields 950, 952, 954 and 956. The film uniformity shields 950, 952, 954, 956 are placed within the chamber so that a more uniform distribution of a coating is produced. The targets 930, 932 are of a first material while the targets 934 and 936 are of a second material.

During the processing of the disc, a high voltage potential is placed on the targets 930, 932 made of a first material such as platinum for a selected amount of time. This accelerates ions from the inert gas within the chamber 913 into the targets or sources 930, 932 so that they are deposited upon the substrate 211. After a selected amount of time, the high potential is removed from the sources or targets 930, 932 and placed on the targets 934, 936 which are made of a second material such as cobalt. By switching the electrical connection between the targets or sources 930 of the first material, between that and the targets or sources 934, 936 of the second material, multiple alternate layers of the two materials can be placed on the substrate. The substrate 211 is spun or rotated throughout the process in order to promote more uniform distribution of the layer onto the substrate 211. The sources 930, 932, 934, 936 can be attached to a switch, such as the microprocessor 2000 control switch 600, shown in FIG. 6. The microprocessor 2000 would then control the switching of the electrical connection of the various targets as well as the time that those particular targets are attached to the switch. In essence, the sources or targets 930, 932, 934 and 936 shown in FIGS. 9 and 10 could be substituted for the sources 330, 332, 334 and 336 shown in FIG. 6. One advantage of this particular embodiment is that the substrate 211 does not have to be translated between the various targets or sources 930, 932, 934 and 936. This would reduce the process time. The film uniformity shields 950, 952, 954 and 956 are placed in the chamber so as to further promote a uniform sputtering of a particular material onto the substrate 211. The film uniformity shields 950, 952, 954, 956 may be adjusted within the chamber 913.

Figure 11:
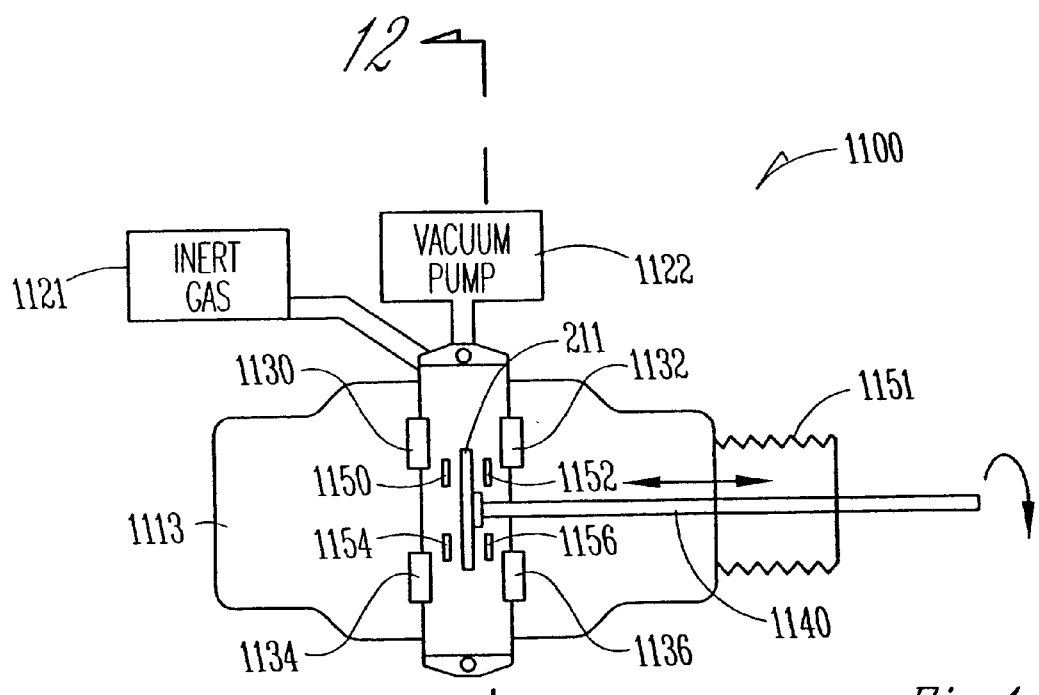
FIG. 11 is a top view of a sputtering machine for depositing multiple alternate layers onto a substrate according to still another embodiment of the present invention.
Figure 12:
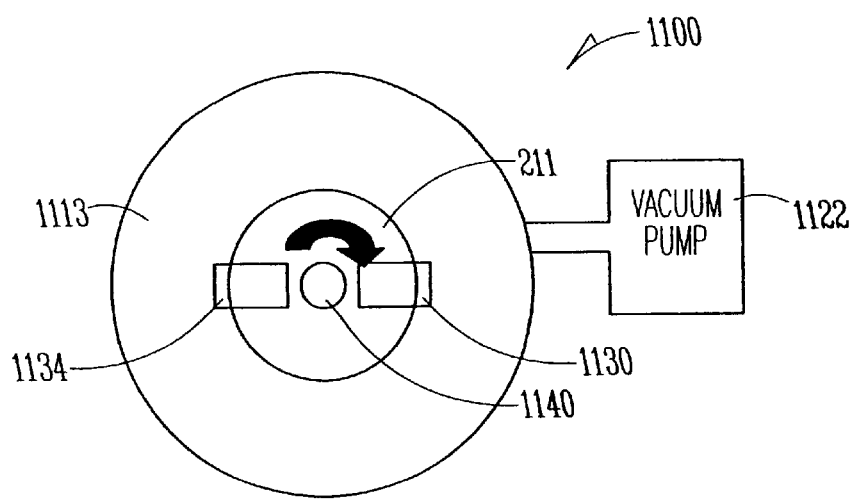
FIG. 12 is a side view of the sputtering machine shown in FIG. 11.

FIGS. 11 and 12 show a top view and a side view of a sputtering machine 1100 for depositing multiple alternate layers onto a substrate. The sputtering machine 1100 includes a vacuum chamber 1113 which is connected to or in fluid communication with a vacuum pump 1122 and a source of inert gas 1121. Four targets 1130, 1132, 1134 and 1136 are located within the chamber 1113. An ID gripper (such as the one shown in FIG. 5) and rotator mechanism 1140 which includes a shaft attached to a mechanism which can spin the shaft and the disc 211 as well as move the shaft 1141 into and out of engagement with the substrate 211. The substrate 211 is typically a disc which will be formed into a magnetic disc such as those found in the disc drive 100 in FIG. 1. A substrate 211 is moved into the chamber 1113. The ID gripper 500 grips the substrate 211 and rotates the substrate 211. The substrate 211 is rotated throughout the process. A bellows 1151 provides for a seal between the chamber 1113 and the input or rotated end of the ID gripper and rotator mechanism 1140. Also positioned within the chamber are a set of film uniformity shields 1150, 1152, 1154 and 1156. The film uniformity shields 1150, 1152, 1154, 1156 are placed within the chamber so that a more uniform distribution of a coating is produced. The targets 1130, 1132 are of a first material while the targets 1134 and 1136 are of a second material.

During the processing of the disc, a high voltage potential is placed on the targets 1130, 1132 made of a first material such as platinum for a selected amount of time. This accelerates ions from the inert gas within the chamber 1113 into the targets or sources 1130, 1132 so that they are deposited upon the substrate 211. After a selected amount of time, the high potential is removed from the sources or targets 1130, 1132 and placed on the targets 1134, 1136 which are made of a second material such as cobalt. By switching the electrical connection between the targets or sources 1130 of the first material, between that and the targets or sources 1134, 1136 of the second material, multiple alternate layers of the two materials can be placed on the substrate. The substrate 211 is spun or rotated throughout the process in order to promote more uniform distribution of the layer onto the substrate 211. The sources 1130, 1132, 1134, 1136 can be attached to a switch, such as the microprocessor 2000 control switch 600, shown in FIG. 6. The microprocessor 2000 would then control the switching of the electrical connection of the various targets as well as the time that those particular targets are attached to the switch. In essence, the sources or targets 1130, 1132, 1134 and 1136 shown in FIGS. 11 and 12 could be substituted for the sources 330, 332, 334 and 336 shown in FIG. 6. One advantage of this particular embodiment is that the substrate 211 does not have to be translated between the various targets or sources 1130, 1132, 1134 and 1136. This would reduce the process time. The film uniformity shields 1150, 1152, 1154 and 1156 are placed in the chamber so as to further promote a uniform sputtering of a particular material onto the substrate 211. The film uniformity shields 1150, 1152, 1154, 1156 may be adjusted within the chamber 1113. The main difference between the sputtering machine 1100 and the sputtering machine 900 is the placement of the cathodes or sources or targets 1130, 1132, 1134 and 1136. This is best shown in FIG. 12 where the targets 1134 and 1130 on one side of the disc are essentially aligned with the shaft of the rotator and gripper mechanism 1140.

Figure 13:
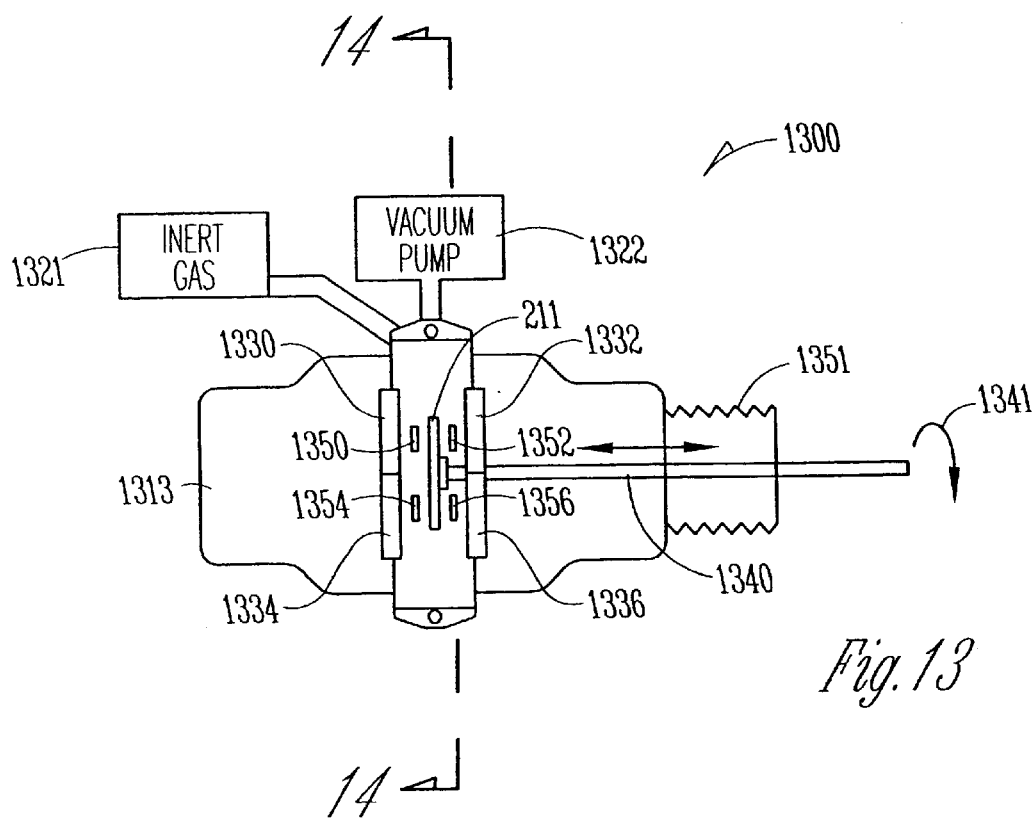
FIG. 13 is a top view of a sputtering machine for depositing multiple alternate layers onto a substrate according to yet another embodiment of the present invention.
Figure 14:
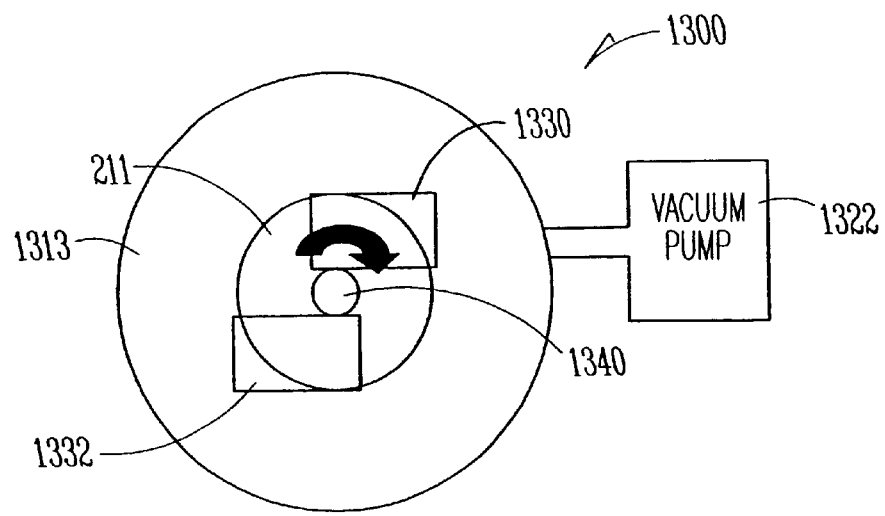
FIG. 14 is a side view of the sputtering machine shown in FIG. 13 for depositing multiple alternate layers onto a substrate.

FIGS. 13 and 14 show a top and side view of a sputtering machine 1300 for depositing multiple alternate layers onto a substrate. The sputtering machine 1300 includes a vacuum chamber 1313 which is connected to or in fluid communication with a vacuum pump 1322 and a source of inert gas 1321. Four targets 1330, 1332, 1334 and 1336 are located within the chamber 1313. An ID gripper (such as the one shown in FIG. 5) and rotator mechanism 1340 which includes a shaft attached to a mechanism which can spin the shaft and the disc 211 as well as move the shaft 1341 into and out of engagement with the substrate 211. The substrate 211 is typically a disc which will be formed into a magnetic disc such as those found in the disc drive 100 in FIG. 1. A substrate 211 is moved into the chamber 1313. The ID gripper 500 grips the substrate 211 and rotates the substrate 211. The substrate 211 is rotated throughout the process. A bellows 1351 provides for a seal between the chamber 1313 and the input or rotated end of the ID gripper and rotator mechanism 1340. Also positioned within the chamber are a set of film uniformity shields 1350, 1352, 1354 and 1356. The film uniformity shields 1350, 1352, 1354, 1356 are placed within the chamber so that a more uniform distribution of a coating is produced. The targets 1330, 1332 are of a first material while the targets 1334 and 1336 are of a second material. During the processing of the disc, a high voltage potential is placed on the targets 1330, 1332 made of a first material such as platinum for a selected amount of time. This accelerates ions from the inert gas within the chamber 1313 into the targets or sources 1330, 1332 so that they are deposited upon the substrate 211. After a selected amount of time, the high potential is removed from the sources or targets 1330, 1332 and placed on the targets 1334, 1336 which are made of a second material such as cobalt. By switching the electrical connection between the targets or sources 1330 of the first material, between that and the targets or sources 1334, 1336 of the second material, multiple alternate layers of the two materials can be placed on the substrate. The substrate 211 is spun or rotated throughout the process in order to promote more uniform distribution of the layer onto the substrate 211. The sources 1330, 1332, 1334, 1336 can be attached to a switch, such as the microprocessor 2000 control switch 600, shown in FIG. 6. The microprocessor 2000 would then control the switching of the electrical connection of the various targets as well as the time that those particular targets are attached to the switch. In essence, the sources or targets 1330, 1332, 1334 and 1336 shown in FIGS. 9 and 10 could be substituted for the sources 330, 332, 334 and 336 shown in FIG. 6. One advantage of this particular embodiment is that the substrate 211 does not have to be translated between the various targets or sources 1330, 1332, 1334 and 1336. This would reduce the process time.

The film uniformity shields 1350, 1352, 1354 and 1356 are placed in the chamber so as to further promote a uniform sputtering of a particular material onto the substrate 211. The film uniformity shields 1350, 1352, 1354, 1356 may be adjusted within the chamber 1313. The main difference between the sputtering machine 1300 and the sputtering machines 1100 and 900 is again placement of the cathodes or sources 1330, 1332, 1334 and 1336. As shown best in FIG. 14, the targets or sources 1332 and 1330 are placed above and below the shaft of the gripper and rotator mechanism 1340.

Figure 15:
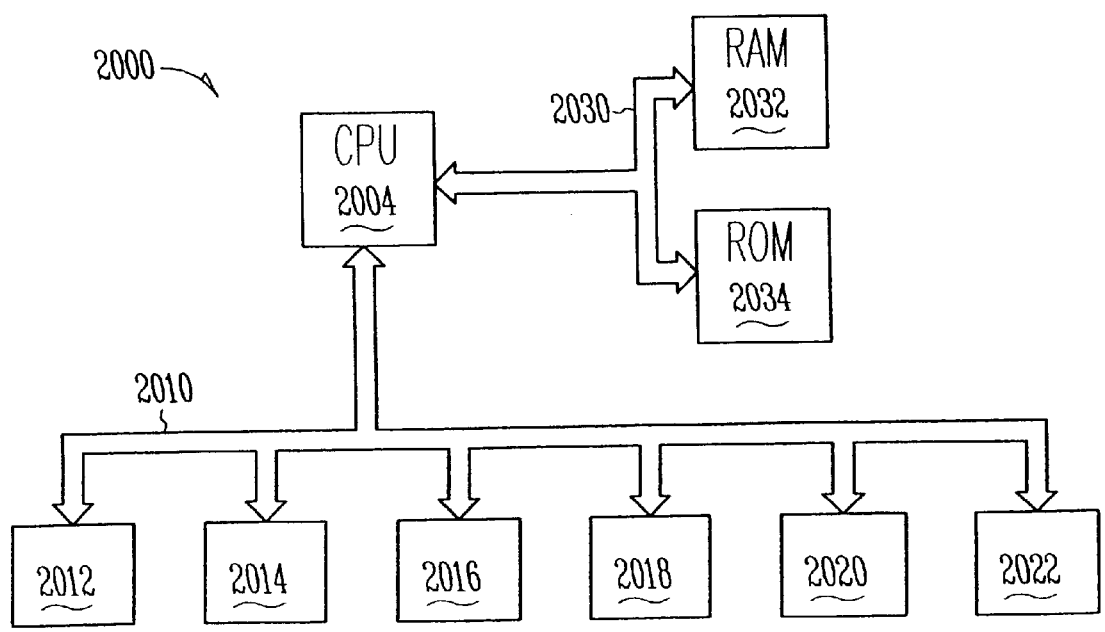
FIG. 15 is a schematic view of a computer system.

FIG. 15 is a schematic view of a computer system. Advantageously, the invention is well suited for use in a computer system 2000. The computer system 2000 may also be called an electronic system or an information handling system and includes a central processing unit, a memory and a system bus. The information handling system includes a central processing unit 2004, a random access memory 2032, a read only memory 2034, and a system bus 2030 for communicatively coupling the central processing unit 2004 and the random access memory 2032 and the read only memory 2034. The information handling system may also include an input/output bus 2010 and several peripheral devices, such as 2012, 2014, 2016, 2018, 2020, and 2022 that maybe attached to the input output bus 2010. Peripheral devices may include hard disc drives, magneto-optical drives, floppy disc drives, monitors, keyboards and other such peripherals. Any type of disc drive may include a storage disc including a thin layer of lubricant deposited according to the teachings of the present invention.

Conclusion

In conclusion, a sputtering apparatus for depositing layers of material onto a substrate includes a vacuum chamber, a first target and a second target positioned within the vacuum chamber. A source of power is placed in electrical communication with the first target and the second target. A switch alternately connects the source of power between the first target and the second target. The first target and the second target are different materials. The sputtering apparatus also includes a transport mechanism for moving a substrate between a first position closer to the first target and a second position closer to the second target. The switch connects power to the first target when the transport mechanism positions the substrate near the first target and the switch connects power to the second target when the transport mechanism positions the substrate closer to the second target. In one embodiment, the first target is ring-shaped and the second target is ring-shaped.

In other embodiments, the sputtering apparatus includes a third target and a fourth target. The first target, second target, third target, and fourth target are ring-shaped. The transport mechanism moves a substrate between a first position between the first target and the third target, and a second position between the second target and the fourth target. The first and third target are attached to the source of power when a substrate is positioned in a first position between the first and third target, and the second target and fourth target are attached to the source of power when a substrate is positioned in a second position between the second and fourth targets. The first target and third target are made of a first material. The second target and fourth target are made of a second material. The material of the first and third target is deposited on a substrate when in a first position, and the material of the second and fourth target are deposited on a substrate when in a second position.

The sputtering apparatus may handle a substrate that includes an inner diameter and an outer diameter. The transport mechanism for such a substrate includes a holder for holding a substrate by the inner diameter. The transport mechanism may also include a bellows for sealing the chamber when the substrate is placed in a first position and in a second position. In some embodiments, the sputtering apparatus for a substrate having an inner diameter and an outer diameter, includes a holder for holding a substrate by the inner diameter, a ram attached to the holder, and a bellows to seal the chamber and the transport mechanism. In some embodiments, the transport mechanism includes a rotator for rotating the substrate.

A method for sputtering within a chamber includes the steps of placing at least two source materials within a chamber, electrically connecting a source of power to one of the source materials within the chamber to sputter a first layer onto a substrate, and disconnecting a source of power from one of the source materials and electrically connecting the source of power to the other of the source materials within the chamber to sputter a second layer onto a substrate. The method further includes the step of moving the substrate closer to the source connected to the source of power. Some embodiments further include the step of spinning the substrate within the chamber. The method may also include holding the substrate by an inner diameter within the chamber. The method for sputtering within a chamber also includes the step of alternately connecting power to one of the sources and then to another source to place a desired number of alternating layers of material on the substrate.

Most generally, a sputtering apparatus includes a chamber, and a device for sputtering layers of alternating material onto a substrate positioned within the chamber.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A sputtering apparatus for depositing layers of material onto a substrate comprising:
    a vacuum chamber;
    a first target positioned within the vacuum chamber;
    a second target positioned within the vacuum chamber;
    a source of power in electrical communication with the first target and the second target;
    a switch for alternately connecting the source of power between the first target and the second target; and
    a transport mechanism for moving a substrate between a first position closer to the first target and a second position, wherein the transport mechanism passes the substrate near one of the first target or the second target.

2. A sputtering apparatus for depositing layers of material onto a substrate comprising:
    a vacuum chamber;
    a first target positioned within the vacuum chamber;
    a second target positioned within the vacuum chamber;
    a source of power in electrical communication with the first target and the second target; and
    a switch for alternately connecting the source of power between the first target and the second target, wherein the first target is ring-shaped and the second target is ring shaped.

3. The sputtering apparatus of claim 2 wherein the first target and the second target are different materials.

4. The sputtering apparatus of claim 2 further comprising a transport mechanism for moving a substrate between a first position closer to the first target and a second position closer to the second target.

5. The sputtering apparatus of claim 4 wherein the switch connects power to the first target when the transport mechanism positions the substrate to the first position near the first target and the switch connects power to the second target when the transport mechanism positions the substrate near the second position closer to the second target.

6. The sputtering apparatus of claim 4 wherein the substrate includes an inner diameter and an outer diameter, wherein the transport mechanism includes a holder for holding a substrate by the inner diameter.

7. The sputtering apparatus of claim 4 wherein the transport mechanism includes a bellows for sealing the chamber when the substrate is placed in a first position and in a second position.

8. The sputtering apparatus of claim 4 wherein the substrate includes an inner diameter and an outer diameter, wherein the transport mechanism further comprises:
    a holder for holding a substrate by the inner diameter, and
    a ram attached to the holder; and
    a bellows to seal the chamber and the transport mechanism.

9. The sputtering apparatus of claim 4 wherein the transport mechanism includes:
    a holder for holding a substrate by an inner diameter of the substrate; and
    a rotator for rotating the substrate.

10. A sputtering apparatus for depositing layers of material onto a substrate comprising:
    a vacuum chamber;
    a first target positioned within the vacuum chamber;
    a second target positioned within the vacuum chamber;
    a source of power in electrical communication with the first target and the second target; and
    a switch for alternately connecting the source of power between the first target and the second target;
    a third target;
    a fourth target, wherein the first target, second target, third target, and fourth target are ring-shaped; and
    a transport mechanism for moving a substrate between a first position between the first target and the third target, and a second position between the second target and the fourth target.

11. The sputtering apparatus of claim 10 wherein the first and third target are attached to the source of power when a substrate is positioned in a first position between the first and third target, and wherein the second target and fourth target are attached to the source of power when a substrate is positioned in a second position between the second and fourth targets.

12. The sputtering apparatus of claim 11 wherein the first target and third target are made of a first material, and wherein the second target and fourth target are made of a second material.

13. The sputtering apparatus of claim 11 wherein the first target and third target are made of a first material, the material of the first and third target being deposited on a substrate when in a first position, and wherein the second target and fourth target are made of a second material, the material of the second and fourth target being deposited on a substrate when in a second position.

14. A method for sputtering within a chamber, the method comprising the steps of:
    placing at least two source materials within a chamber;
    electrically connecting a source of power to one of the source materials within the chamber to sputter a first layer onto a substrate;
    disconnecting a source of power from one of the source materials and electrically connecting the source of power to the other of the source materials within the chamber to sputter a second layer onto a substrate;
    spinning the substrate substantially about an axis of the substrate; and
    moving the substrate linearly along the axis of the substrate.

15. The method for sputtering within a chamber of claim 14 further comprising the step of moving the substrate closer to the source connected to the source of power.

16. The method for sputtering within a chamber of claim 14 further comprising the step of holding the substrate by an inner diameter within the chamber.

17. The method for sputtering within a chamber of claim 14 further comprising the step of alternately connecting power to one of the sources and then to another source to place a desired number of alternating layers of material on the substrate.

18. A sputtering apparatus for depositing layers of material onto a substrate comprising:
- a vacuum chamber;
- a first target positioned within the vacuum chamber;
- a second target positioned within the vacuum chamber;
- a source of power in electrical communication with the first target and the second target;
- a switch for alternately connecting the source of power between the first target and the second target; and
- a transport mechanism for moving a substrate between a first position closer to the first target and a second position closer to the second target, wherein the transport mechanism includes:
  - a portion adapted to rotate the substrate about an axis associated with the substrate; and
  - a portion that moves the substrate linearly substantially along the axis associated with the substrate.

19. The sputtering apparatus of claim 18 further comprising a third and fourth target, wherein the first and third target are made of a first material and are positioned near one another, and the second and fourth target are made of a second material and positioned near one another and wherein the transport mechanism positions the substrate between the first and third target when the first target is connected to the source of power and moves the substrate along a line corresponding substantially to the axis associated with the substrate to a position between the second and fourth target when the second target is connected to the source of power.

* * * * *